United States Patent [19]

Scherber

[11] 3,791,023

[45] Feb. 12, 1974

[54] METHOD OF MANUFACTURING A FIELD EFFECT TRANSISTOR

[75] Inventor: Werner Scherber, Heilbronn, Germany

[73] Assignee: Licentia Patent-Verwaltungs GmbH, Frankfurt am Main, Germany

[22] Filed: Dec. 10, 1971

[21] Appl. No.: 206,635

[30] Foreign Application Priority Data

Dec. 21, 1970 Germany .......................... 2061810

[52] U.S. Cl. .................................... 29/571, 29/578

[51] Int. Cl. ........................................... B01j 17/00

[58] Field of Search ............................. 29/571, 578

[56] References Cited

UNITED STATES PATENTS

| | | | |
|---|---|---|---|
| 3,504,430 | 4/1970 | Kubo | 29/571 |
| 3,675,314 | 7/1972 | Levi | 29/578 |

*Primary Examiner*—Roy Lake
*Assistant Examiner*—W. C. Tupman
*Attorney, Agent, or Firm*—Spencer & Kaye

[57] ABSTRACT

A method of manufacturing a field effect transistor comprises forming a nitride layer on the surface of a semiconductor body of a first type of conductivity containing two spaced regions of a second type of conductivity; forming an oxide layer on the nitride layer; forming windows in the nitride and oxide layers extending to the surface of the semiconductor body above the two regions of the second type of conductivity and above the zone between the two regions; forming a thin oxide layer in the window above the zone between the two regions; forming a gate control electrode in the window above the zone between the two regions and forming contacts in the windows above the two regions.

10 Claims, 6 Drawing Figures

METHOD OF MANUFACTURING A FIELD EFFECT TRANSISTOR

BACKGROUND OF THE INVENTION

The invention relates to a method for manufacturing a field effect transistor from a semiconductor body with one type of conductivity into one surface of which are recessed two spaced apart regions having the other type of conductivity, and wherein the gate electrode is arranged on an oxide layer across the channel region between the two regions.

In finished MOS field effect transistors, the channel between the two regions with the second type of conductivity is covered by a thin oxide layer. By means of a suitable potential applied to the gate electrode, an inversion layer is produced in the channel, so that a current flows through the channel between the two regions with the second type of conductivity, if a voltage is applied between the two main electrodes, forming the electric contacts on the regions with the second type of conductivity. This current can be varied by means of the potential applied to the gate electrode.

For the better understanding of the method according to the invention, the present manufacture of field effect transistor of the type mentioned above will be briefly described.

A comparatively thick layer of silicon dioxide is applied to one surface of a silicon semiconductor body with n-type conductivity. The thickness must be selected in such a way that the conductor path to be manufactured later and extending over the oxide layer, and leading to the main electrodes, are no longer capable of producing inversion layers in the semiconductor body. Such inversion layers under the main electrodes of field effect transistors, frequently called the source and the drain electrodes, are undesirable, particularly in integrated circuits where they may cause short circuits between adjacent field effect transistors. The said first oxide layer may have a thickness of e.g., 2 $\mu$m.

Since thick oxide layers are difficult to etch with sharp contours and to accurate dimensions, the diffusion of the two regions with the second type of conductivity is carried out in several steps.

To this end, a first large opening is made into the first thick oxide layer, using known masking and etching techniques. This opening is then again closed by a thinner, more easily etched oxide layer. This process provides a first step between the oxide layers of different thicknesses. Then, two spaced apart openings are made in the second, thinner oxide layer, again using masking and etching methods, and the regions with the second type of conductivity are diffused into the semiconductor body through these two openings.

Next, the diffusion windows are again closed by a new oxide layer. This third oxide layer is thinner than the other layers, thereby producing a second step in the oxide layer coating. By a further masking and etching step, the contact-making windows are made in the oxide covering the two regions with the second type of conductivity. Simultaneously, the oxide is removed from the surface of the semiconductor in the zone between the two regions. After this, a further oxidation process is necessary for producing the extremely thin oxide above the controllable channel zone. This oxide must again be removed in the contacting windows. Then, metal is applied by evaporation to the semiconductor surface and the distinct contacts for the gate electrode, the source electrode and the drain electrode are made by subsequent masking and etching the metal layer.

The manufacture just described has a number of substantial drawbacks. The layer of photo-resist necessary for the masking is to be distributed uniformly over the semiconductor wafer by spinning. However, agglomerations of photoresist form at the steps in the oxide, so that the masking process becomes inaccurate or ineffective at these points. In addition, the edges of the step make the manufacture of metal conductor paths difficult because the conductor paths become very thin in the zones of steep steps. Many circuits fail due to ruptures of conductor paths on oxide steps.

It is very difficult to keep all stages so clean that the oxide in the zone above the controllable channel is stable, and more particularly free from sodium ions. The oxide above the channel region is mainly contaminated by the contaminated oxide layers in adjacent regions.

SUMMARY OF THE INVENTION

It is an object of the invention to avoid or reduce the above described disadvantages.

According to one aspect of the invention there is provided a method of manufacturing a field effect transistor comprising the steps of forming in one side of a semiconductor body of a first type of conductivity, two spaced regions of a second type of conductivity extending from the surface of said semiconductor body; forming a thin nitride layer on said surface of said semiconductor body; forming an oxide layer on said thin nitride layer; forming windows extending to said surface of said semiconductor body in said oxide and said thin nitride layers above both said regions of said second type of conductivity and in the zone between said regions of said second type of conductivity; forming a thin oxide layer in said window in said zone between said regions of said second type of conductivity; forming a gate electrode in said thin oxide layer and forming contacts in said windows above said regions of said second type of conductivity.

According to a second aspect of the invention, there is provided a method of manufacturing a field effect transistor comprising the steps of forming a masking layer on one surface of a semiconductor body of a first type of conductivity; diffusing two spaced regions of a second type of conductivity through windows in said masking layer; removing said masking layer from said semiconductor body; forming a thin nitride layer on said one surface of said semiconductor body; forming an oxide layer on said thin nitride layer; forming windows extending to said one surface of said semiconductor body in said oxide and said nitride layers above both said regions of said second type of conductivity and in the zone between said regions of said second type of conductivity; forming a thin oxide layer in said window in said zone between said regions of said second type of conductivity; forming a gate electrode on said thin oxide layer and forming contacts in said windows above said regions of said second type of conductivity.

According to a third aspect of the invention, there is provided a method of manufacturing a field effect transistor comprising the steps of forming a masking layer on one surface of a semiconductor body of a first type of conductivity; diffusing two spaced regions of a second type of conductivity through windows in said masking layer; removing said masking layer from the major part of said semiconductor body but leaving said masking layer wholly or partially above the zone between said regions of said second type of conductivity; forming a thin nitride layer on said one surface of said semiconductor body; forming an oxide layer on said thin nitride layer; forming windows extending to said one surface of said semiconductor body in said oxide and said nitride layers above both said regions of said second type of conductivity and in said zone between said regions of said second type of conductivity including removing the part of said masking layer left above said zone between said regions of said second type of conductivity; forming a thin oxide layer in said window in said zone between said regions of said second type of conductivity; forming a gate electrode on said thin oxide layer and forming contacts in said windows above said regions of said second type of conductivity.

BRIEF DESCRIPTION OF THE DRAWINGS

The invention will now be described in greater detail, by way of example, with reference to the accompanying drawings, in which.

DESCRIPTION OF THE PREFERRED EMBODIMENT

Figure 1:
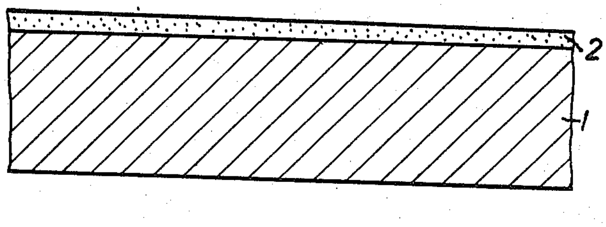
FIG. 1 is a cross-sectional view of a semiconductor body in the first stage of the manufacture of a field effect transistor in accordance with the method of the invention.

In a preferred form, the invention proposes a method of manufacturing a field effect transistor comprising a semiconductor body with a first type of conductivity containing two spaced regions of a second type of conductivity in one surface thereof and a gate electrode arranged on an oxide layer across the channel region between the two space regions, in such a way that, after manufacture of the two regions with the second type of conductivity, the masking layer covering the semiconductor surface is removed. The semiconductor surface is then covered with a thin layer of nitride, and the layer of nitride with a layer of oxide. Windows over both regions are made in these two layers reaching down to the semiconductor surface, and both layers are removed in the zone between the two regions. The zone between the two regions is covered with a thin oxide layer, and the oxide layer with a gate electrode. Contacts are made in the windows on both regions with the second type of conductivity.

The method according to the invention is particularly suitable for semiconductor arrangements, or integrated semiconductor circuits which are arranged in a silicon semiconductor body. In this case, the oxide layers consist preferably of a silicon oxide and, more particularly, of silicon dioxide, whilst the nitride layer consists of silicon nitride.

The silicon oxide layer and the silicon nitride layer thereunder are preferably produced by pyrolytic deposition. The thin oxide under the gate electrode is preferably produced by thermal oxidation of silicon.

The method according to the invention finds a particularly useful application in the manufacture of integrated circuits consisting wholly or partially of a plurality of field effect transistors with insulated gate electrode.

The method according to the invention has a number of advantages. All used insulated layers are comparatively thin. This means that no undesirable high steps can disturb the photo resist, etching or evaporation procedures. Even the step in the topmost, pyrolytically produced oxide is comparatively shallow and has usually a height of about 0.5 $\mu$m. In view of these comparatively thin insulating layers, even very small structures may be produced accurately and with sharp contours. The length of the channel may be kept very small, enabling the packing density of field effect transistors to be increased.

For removing the insulating layer above the controllable channel between the two semiconductor regions with the second type of conductivity, an exact adjustment of the mask on the semiconductor plate is necessary. However, this adjustment is facilitated, compared with the known method, because the masking and the subsequent etching may be based on a flat surface. Since it is possible in this manner to keep the overlap between the gate electrode and the regions with the second type of conductivity small, the limiting frequency of field effect transistors made in accordance with the invention is increased.

In the arrangement made according to the invention, the oxide above the controllable channel between the two regions with the second type of conductivity is hermetically screened against environmental influences. The material for the gate electrode is preferably aluminium.

In this case, the thin oxide layer above the controllable channel is surrounded on all sides by aluminium or silicon nitride. These two substances are completely impermeable to sodium ions and other impurities. Sodium ions would modify the threshold voltage of the field effect transistor in an undesirable manner. Since this is impossible in the field effect transistor manufactured according to the invention, the hermetically sealed enclosure of this transistor is not absolutely essential. These transistors or integrated circuits with MOS field effect transistors made in this manner may, for example, be fused in cheap plastic packages.

The masking layer used for diffusing semiconductor regions with the second type of conductivity is completely removed from the semiconductor surface after the diffusion. In this case, the semiconductor surface may then be thoroughly cleaned, using also substances which might attack the masking layer. The masking layer consists in the case of silicon semiconductor bodies preferably of thermally produced silicon dioxide.

However, there is also the possibility of leaving the masking layer above the controllable channel between the two semiconductor regions with the second type of conductivity wholly or partially on the semiconductor surface. This masking spot, usually consisting of thermally produced oxide, is removed in this case only prior to the manufacture of the thin oxide layer in the zone between the two regions for the semiconductor surface. The intermediate steps are carried out as already described. The modified method has the advantage that the sensitive channel zone is always protected by an oxide layer.

The method according to the invention reduces the number of steps and the manufacturing time required, compared with the known method.

Referring now to the drawings, one embodiment of the invention is shown in different stages of manufacture. The semiconductor arrangement shown concerns an integrated circuit with a plurality of field effect transistors. For the sake of simplicity, only a section of the arrangement with one transistor is shown.

Figure 2:
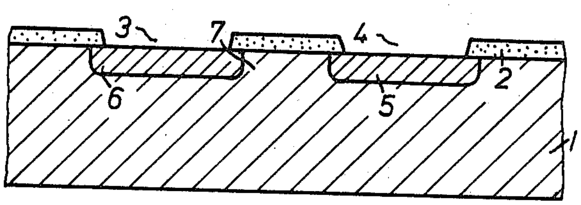
FIG. 2 is a view similar to FIG. 1, but showing a second stage of the method.

According to FIG. 1 a silicon semiconductor body 1 of n-type conductivity is used which is covered on one surface with a silicon dioxide layer 2. This layer is preferably produced by thermal oxidation and may have a thickness of about 0.5 $\mu$m. Two openings 3 and 4 are provided spaced apart from each other in the oxide layer 2 of FIG. 2, using the known photo-resist masking, and etching Through the two openings 3 and 4, for example, boron is diffused into the semiconductor body, so that the semiconductor body acquires p-type conductivity in the zone of the two surface regions 5 and 6. The channel 7 comprises the distance between these two regions with *p*-type conductivity.

Figure 3:
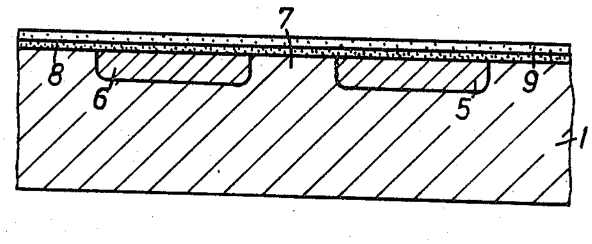
FIG. 3 is a view similar to FIG. 1, but showing a third stage of the method.

After the manufacture of the two regions 5 and 6, the oxide layer 2 is completely removed from the semiconductor surface. As shown in FIG. 3, the semiconductor surface is then covered with a silicon nitride layer 8, having a thickness of e.g., 0.2 $\mu$m. This layer may be produced, for example, by pyrolytic decomposition from the starting materials monosilane and ammonia. Over the silicon nitride layer, a silicon dioxide layer 9 is applied, having a thickness of e.g., 0.5 $\mu$m and produced by pyrolytic decomposition with the starting materials monosilane and oxygen. For producing the nitride layer and the oxide layer, other deposition processes may also be used.

Figure 4:
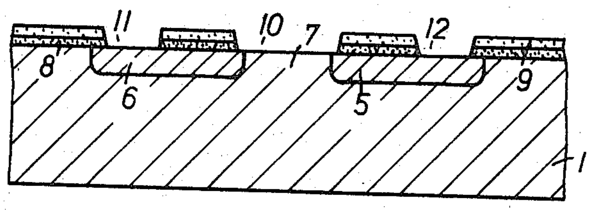
FIG. 4 is a view similar to FIG. 1, but showing a fourth stage of the method.

As shown in FIG. 4, windows 10,11 and 12 are then made in the two layers 8 and 9 above the channel 7, and over the two regions 5 and 6 with the second type of conductivity. The window 10 above the channel must extend over the whole channel. The window in the oxide layer are made by means of the known photoresist masking and etching process. The parts of the nitride layer located thereunder are preferably removed with boiling phosphoric acid, with the oxide layer serving as mask.

Then, the exposed surface regions are covered by thermal oxidation with a thin layer of oxide 13 which is left only on the surface of the channel region 7. This oxide is formed in a high-purity process, and has a thickness corresponding to the thickness required for the oxide layer under the gate electrode. It may amount, for example to 1,000 A. This stage of the manufacture is shown in FIG. 5.

Figure 5:
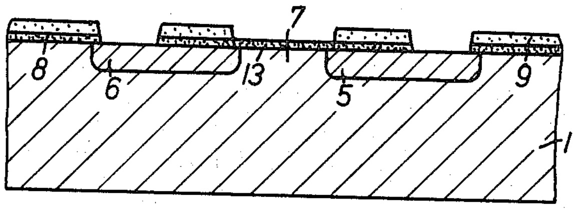
FIG. 5 is a view similar to FIG. 1, but showing a fifth stage of the method.
Figure 6:
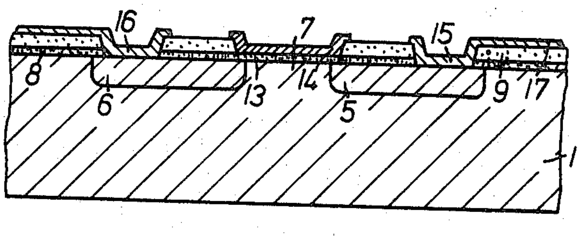
FIG. 6 is a view similar to FIG. 1 but showing the finished field effect transistor.

Next, a layer of metal, for example aluminium, is applied by evaporation to the semiconductor arrangement shown in FIG. 5. By masking and etching according to FIG. 6, the metal layer is divided into the gate electrode 13 and the source and drain electrodes 15 and 16.

Preferably all electrodes extend over the oxide layer 9, but care must be taken with the gate electrode that it overlaps the *p-n* junctions surrounding the two regions 5 and 6 as little as possible, in order to keep the capacitance of the element small.

The electrodes 15 and 16 extend, in the direction remote from the gate electrode, over the oxide layer 9 and terminate there in conductor paths 17 which either lead to adjacent devices or terminate in large area connecting contacts. Although the oxide layer under these conductor paths is comparatively thin there is no danger that inversion layers might be formed in the semiconductor surface in undesirable positions. This is due, on the one hand, to the fact that the layers covering the semiconductor surface are very pure. On the other hand, the nitride layer arranged on the semiconductor surface counteracts the formation of an inversion layer, and this is due to the material properties of the nitride layer.

It will be understood that the present invention is susceptible to various modification changes and adaptations.

What is claimed is:

1. A method of manufacturing a field effect transistor comprising the steps of forming a masking layer on one surface of a semiconductor body of a first type of conductivity; diffusing two spaced regions of a second type of conductivity through windows in said masking layer; removing said masking layer from said semiconductor body; forming a thin nitride layer on said one surface of said semiconductor body; forming an oxide layer on said thin nitride layer; forming windows extending to said one surface of said semiconductor body in said oxide and said nitride layers above both said regions of said second type of conductivity and in the zone between said regions of said second type of conductivity forming a thin oxide layer in said window in said zone between said regions of said second type of conductivity; forming a gate electrode on said thin oxide layer and forming contacts in said windows above said regions of said second type of conductivity.

2. A method as defined in claim 1, and comprising forming said oxide layers of silicon dioxide and forming said nitride layer of silicon nitride.

3. A method as defined in claim 2 and comprising forming said silicon nitride layer and said silicon dioxide layer on said silicon nitride layer pyrolitically.

4. A method as defined in claim 2 and comprising forming said two regions of said second type of conductivity in a silicon semiconductor body of n-type conductivity.

5. A method as defined in claim 4 and comprising forming said gate electrode of aluminium.

6. A method as defined in claim 1 and comprising forming said thin layer of oxide in said window in said zone between said regions of said second type of conductivity by thermal oxidation.

7. A method as defined in claim 1 and comprising forming said windows in said nitride layer and said oxide layer on said nitride layer by removing said oxide layer in a photo resist and etching process with hydrofluoric acid and removing said nitride layer with phosphoric acid using said oxide layer as a mask.

8. A method as defined in claim 1, and comprising forming said contacts in said windows above said regions of said second type of conductivity to extend in the form of conducting paths over said oxide layer on said nitride layer.

9. A method as defined in claim 8, and comprising connecting said conducting paths with contacts of other devices in said semiconductor body.

10. A method as defined in claim 8, and comprising terminating said conducting paths in large area connecting contacts.

* * * * *